US010535570B1

(12) United States Patent
Ando et al.

(10) Patent No.: US 10,535,570 B1
(45) Date of Patent: Jan. 14, 2020

(54) COINTEGRATION OF III-V CHANNELS AND GERMANIUM CHANNELS FOR VERTICAL FIELD EFFECT TRANSISTORS

(71) Applicant: INTERNATIONAL BUSINESS MACHINES CORPORATION, Armonk, NY (US)

(72) Inventors: Takashi Ando, Tuckahoe, NY (US); Pouya Hashemi, White Plains, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/015,315

(22) Filed: Jun. 22, 2018

(51) Int. Cl.
*H01L 21/82* (2006.01)
*H01L 21/02* (2006.01)
(Continued)

(52) U.S. Cl.
CPC .......... *H01L 21/823885* (2013.01); *H01L 21/02164* (2013.01); *H01L 21/02236* (2013.01); *H01L 21/02255* (2013.01); *H01L 21/02532* (2013.01); *H01L 21/02538* (2013.01); *H01L 21/02603* (2013.01); *H01L 21/324* (2013.01); *H01L 21/823807* (2013.01); *H01L 21/823814* (2013.01); *H01L 27/092* (2013.01); *H01L 29/0676* (2013.01); *H01L 29/161* (2013.01); *H01L 29/20* (2013.01); *H01L 29/7827* (2013.01)

(58) Field of Classification Search
CPC ....... H01L 21/823885; H01L 21/02236; H01L 21/823814; H01L 29/7827; H01L 29/0676; H01L 29/20; H01L 29/161; H01L 27/092; H01L 21/02603; H01L 21/02538; H01L 21/02532; H01L 21/324; H01L 21/02164; H01L 21/02255; H01L 21/823807
USPC .......................................................... 257/329
See application file for complete search history.

(56) References Cited

U.S. PATENT DOCUMENTS 9,129,863 B2 9/2015 Caimi et al.
9,171,929 B2 10/2015 Lee et al.
(Continued)

FOREIGN PATENT DOCUMENTS

CN 103021815 B 6/2015
WO 2013095341 A1 6/2013
WO 2015199655 A1 12/2015

*Primary Examiner* — Caleen O Sullivan
(74) *Attorney, Agent, or Firm* — Cantor Colburn LLP; Vazken Alexanian (57) ABSTRACT

Methods for forming cointegrated III-V and Ge channels for vertical field effect transistors are described. Aspects of the invention include forming a first fin and a second fin on a substrate, wherein the first fin includes a first material including a first semiconductor material at a first concentration level, and wherein the second fin includes a second material including a second semiconductor material at a second concentration. A condensation oxidation is performed to increase the first concentration level to a targeted first final concentration level and increase the second concentration level to a targeted second final concentration level. The second fin is replaced with a third fin including a third material including a combination of a group III element with a group V element.

16 Claims, 11 Drawing Sheets

(51) Int. Cl.
*H01L 21/8238* (2006.01)
*H01L 21/324* (2006.01)
*H01L 27/092* (2006.01)
*H01L 29/161* (2006.01)
*H01L 29/20* (2006.01)
*H01L 29/06* (2006.01)
*H01L 29/78* (2006.01)

(56) References Cited

U.S. PATENT DOCUMENTS

| | | |
|---|---|---|
| 9,343,559 B2 | 5/2016 | Glass et al. |
| 9,390,980 B1 | 7/2016 | Cohen et al. |
| 2011/0108920 A1* | 5/2011 | Basker ............... H01L 21/845 |
| | | 257/351 |
| 2016/0181105 A1* | 6/2016 | Cheng ............... H01L 29/785 |
| | | 257/506 |
| 2017/0033017 A1* | 2/2017 | Balakrishnan ...... H01L 27/0924 |
| 2017/0162447 A1* | 6/2017 | Glass ............. H01L 21/823821 |

* cited by examiner

COINTEGRATION OF III-V CHANNELS AND GERMANIUM CHANNELS FOR VERTICAL FIELD EFFECT TRANSISTORS

BACKGROUND

The present invention generally relates to fabrication methods and resulting structures for semiconductor devices. More specifically, the present invention relates to the cointegration of vertical field effect transistors (VFETs) having III-V channel material with VFETs having germanium (Ge) channels material on the same substrate.

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by incorporating n-type or p-type impurities in the layer of semiconductor material. A conventional geometry for MOSTFETs is known as a planar device geometry in which the various parts of the MOSFET device are laid down as planes or layers.

A type of MOSFET is a non-planar FET known generally as a vertical field effect transistor (VFET). VFETs employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls. As silicon CMOS (complementary metal oxide semiconductor) technology reaches fundamental scaling limits, alternative materials such as high mobility III-V compounds and Ge have proven to be contenders for extending high performance logic devices.

SUMMARY

Embodiments of the present invention are directed to a method for fabricating a semiconductor device. A non-limiting example of the method includes forming a first fin and a second fin on a substrate, wherein the first fin includes a first material including a first semiconductor material at a first concentration level, and wherein the second fin includes a second material including a second semiconductor material at a second concentration. A condensation oxidation is performed to increase the first concentration level to a targeted first final concentration level and increase the second concentration level to a targeted second final concentration level. The second fin is replaced with a third fin including a third material including a combination of a group III element with a group V element.

Embodiments of the present invention are directed to a method of fabricating a semiconductor device. A non-limiting example of the method includes forming a first fin and a second fin on a substrate, wherein the first fin includes a first material including a first semiconductor material at a first concentration level, and wherein the second fin includes a second material including a second semiconductor material at a second concentration level. A condensation oxidation is performed to increase the first concentration level to a third concentration level and increase the second concentration level to a fourth concentration level.

Embodiments of the invention are directed to a semiconductor device. A non-limiting example of the a first fin formed on a substrate and a second fin formed on the substrate, wherein the second fin includes a second semiconductor material including a silicon germanium alloy having a germanium content including from about 80 to about 100 atomic percentage (%) germanium, and wherein the first fin includes a third semiconductor material including a combination of a group III element with a group V element.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-20 depict a method for forming a VFET according to embodiments of the invention, in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

Vertical transistors (VFETs), in which source/drain regions are arranged on opposing ends of a vertical channel region (nanowire or fin) surrounded by a gate, are attractive candidates for scaling MOSFETs to smaller dimensions. VFETs can provide higher density scaling that alleviate middle-of-line (MOL) fabrication complexity. One particular type of VFET includes forming some VFET channel from III-V compound material and forming other VFET channels from Ge to provide better electrostatic gate control. III-V compound semiconductors are obtained by combining group III elements (e.g., Al, Ga, In) with group V elements (e.g., N, P, As, Sb). VFETs can be scaled to even smaller dimensions by increasing the aspect ratio of the VFET's channel fin. A problem with Ge fin channels is that epitaxially growing the Ge nanowire to a desired height and having a high Ge content can cause crystalline defects in the fin structure. A method for forming high atomic percentage SiGe (silicon germanium) nanowires cointegrated with III-V nanowires is desired.

Turning now to an overview of aspects of the invention, one or more embodiments of the invention include providing VFETs having nanowires with different channel compositions. Particularly, a CMOS VFET includes two nanowires channels each a different semiconductor material. The first nanowire can have a SiGe channel with the germanium content including an atomic percentage of between about 80% to about 100% which is utilized for the p-type transistor. The second nanowire can have a III-V material channel utilized for the n-type transistor in a CMOS configuration. Vertical FETs typically are not formed using both III-V and Ge channels due to the difficulties in integrating free-standing III-V and Ge nanostructures on a silicon substrate.

Figure 1:
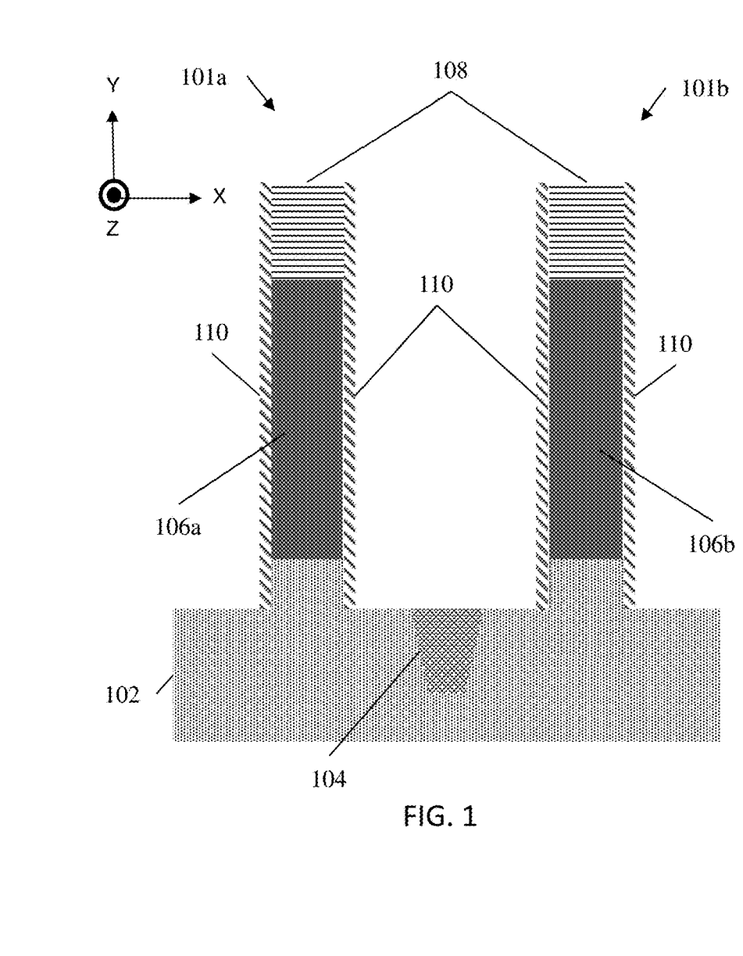
FIG. 1 depicts a cross-sectional view of a portion of a semiconductor structure after initial fabrication operations for forming a VFET device according to one or more embodiments of the invention.

Turning now to a more detailed description of aspects of the present invention, FIGS. 1-20 depict a method for forming a CMOS vertical transport FET according to embodiments of the invention. More specifically, FIG. 1 depicts a cross-sectional view of a semiconductor structure 101a, 101b formed in a portion of a substrate 102 after fabrication operations have been used to form fins or nanowires 106a, 106b on the substrate 102. A variety of fabrication operations are suitable for forming the semiconductor structure 101a, 101b. Because such fabrication operations are well-known, they have been omitted in the interest of brevity. The semiconductor structure 101a, 101b includes a structure that will become a first semiconductor device 101a, along with a structure that will become a second semiconductor device 101b. The first fin or nanowire 106a is part of the first semiconductor device 101a, and the second fin or nanowire 106b is part of the second semiconductor device 101b. According to an exemplary embodiment of the invention, the first semiconductor device 101a when finalized will be an nFET, and the second semiconductor device 101b when finalized will be a pFET. In one or more embodiments of the present invention, the substrate 102 can have a <111> crystal face exposed for subsequent depositions, where the crystal lattice can facilitate epitaxial growth. The fins or nanowires 106a, 106b each include a hard mask cap 108. The fins or nanowires 106a, 106b can be formed in the substrate 102 by depositing a hard mask material over the substrate 102, followed by patterning and etching. The fins or nanowires 106a, 106b also can be patterned in the substrate 102 by, for example, sidewall imaging transfer.

With reference to the X/Y/Z diagram depicted in FIG. 1, the various elements depicted in FIGS. 1-20 extend along a first axis (e.g., X-axis) to define width dimensions, and extend along a second axis (e.g., Y-axis) perpendicular to the X-axis to define height dimensions. Although not specifically depicted in the 2D cross-sectional views shown in FIGS. 1-20, the various elements depicted also extend along a third axis (e.g., Z-axis) perpendicular to the first axis and the second axis to define depth dimensions. In accordance with standard VFET transistors architectures, various elements of the depicted fabrication stages extend completely around other elements in the X, Y, and Z directions.

An isolation region 104 is formed between the active areas of the first transistor 101a and the second transistor 101b. The isolation region 104 can be formed by any known method including, for example, lithography and etching to form trenches in the substrate 104, and then filling the trenches with an insulating material, such as silicon dioxide. After forming isolation region 104, an active region is defined as the region between a pair of isolation regions. According to one or more embodiments of the invention, the isolation region 104 is a shallow trench isolation region (STI). However, the isolation region can be a trench isolation region, a field oxide isolation region (not shown), or any other equivalent known in the art. The isolation region 104 provides isolation between neighboring gate structure regions, and can be used when the neighboring gates have opposite conductivities, such as NFETs and PFETs. As such, the at least one isolation region can separate an NFET device region from a PFET device region.

In one or more embodiments of the invention, the fins 106a, 106b are silicon germanium (SiGe). In some embodiments of the invention, the SiGe fins 106a, 106b can be within a range from SiGe 20% to SiGe 40%. The notations "SiGe 20%" and "SiGe 40%" are used to indicate that about 20% of the SiGe material is Ge, or that about 40% of the SiGe material is Ge, respectively. As described herein, the SiGe fins 106a, 106b are grown on the substrate 102 at SiGe20% to about SiGe 40% because higher than the 40% concentration at a desired thickness of about 15 nm can cause crystalline defects in the fin structure. In the illustrated example, the concentration of germanium is 20% so the compound for the fins 106a, 106b is SiGe20%. At SiGe20%, the thickness of the fins 106a, 106b can be greater than about 15 nm. In one or more embodiments of the invention, the SiGe20% fins 106a, 106b can be epitaxially grown from the substrate 102. A patterned hardmask 108 can be formed on top of the fins 106a, 106b and the exposed SiGe20% can be etched using, for example, reactive ion etching (ME). A portion of the substrate 102 can be etched causes a portion of the substrate 102 to extend upwards beneath the fins 106a, 106b. A spacer layer 110 is deposited on the fins 106a, 106b. The spacer layer 110 is a protective layer spacer on sidewalls of the fins 106a, 106b. After depositing the spacer layer 110 on the fins 106a, 106b, the spacer layer 110 is etched to expose the top surface of the fins 106a, 106b (or the hardmask caps 108).

Non-limiting examples of materials for the spacer layer 110 include dielectric oxides (e.g., silicon oxide), dielectric nitrides (e.g., silicon nitride), dielectric oxynitrides, or any combination thereof. The spacer material is deposited by a deposition process, for example, chemical vapor deposition (CVD) or physical vapor deposition (PVD). The spacer material can be etched by a dry etch process, for example, a RIE process.

Figure 2:
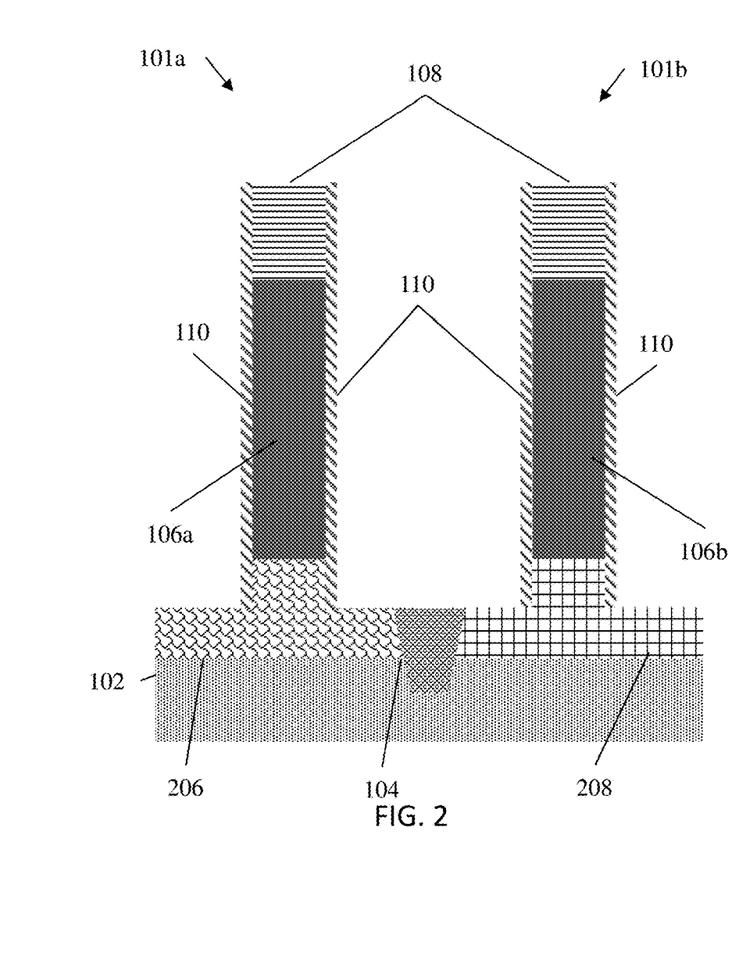
FIG. 2 depicts a cross-sectional view of a portion of semiconductor structure after fabrication operations according to one or more embodiments of the invention.

FIG. 2 depicts a cross-sectional side view after depositing a semiconductor material 206 on the substrate 102 to form a bottom source/drain of the first transistor 101a. A mask is deposited over the second transistor 101b and portions of the substrate 102 and a portion of the STI 104. The bottom portions of the fin 106a of the first transistor 101a are recessed, at interface with the substrate 102. The substrate 102 surface is vertically etched to expose the sidewall surfaces of the fin 106a. The semiconductor material 206 is deposited on the substrate 102 to form the bottom source/drain of the first transistor 101a.

A semiconductor material 208 is deposited on the substrate 102 to form a bottom source/drain of the second transistor 101b. The mask over the second transistor 101b is removed and a second mask is deposited over the first transistor 101a and portions of the substrate 102 and portions of the STI 104 while depositing the semiconductor material 208. The bottom portions of the fin 106b are recessed, at interface with the substrate 102. The substrate 102 surface is vertically etched to expose the sidewall surfaces of the fin 106b. The semiconductor material 208 is deposited on the substrate 102 to form the bottom source/drain of the second transistor 101b.

In one or more embodiments of the invention, the semiconductor material 206, 208 is epitaxially grown semiconductor material. The spacer layer 110 on the fin sidewalls protects the fins from deposition of semiconductor material during the epitaxial growth process. Epitaxial layers can be grown from gaseous or liquid precursors. Epitaxial growth can be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C), for example, can be doped during deposition by adding a dopant or impurity to form a silicide. The semiconductor material 206, 208 is doped with an n-type dopant (e.g., phosphorus, arsenic, or antimony) or a ptype dopant (e.g., boron), depending on the type of transistor. In one or more embodiments of the invention, the semiconductor material 206 for the first transistor 101a is n-type and the semiconductor material 208 for the second transistor 101b is p-type.

In some exemplary embodiments of the invention, the first transistor 101a is an NFET, and the semiconductor material 206 is epitaxially grown silicon doped with phosphorus or any other suitable n-type dopant. In other exemplary embodiments of the invention, the second transistor 101b is a PFET, and the semiconductor material 208 is epitaxially grown silicon germanium doped with boron or any other suitable p-type dopant.

In one or more embodiments of the invention, an annealing occurs. Annealing is performed to drive dopants from the semiconductor material 206, 208 into the substrate 102 and fins 106a, 106b at the source/drain junction.

The annealing is performed by, for example, heating inside a furnace or performing a rapid thermal treatment in an atmosphere containing pure inert gases (e.g., nitrogen or argon) or utilizing laser anneal. The anneal process can be, for example, a rapid thermal anneal (RTA) or rapid thermal processing (RTP).

Figure 3:
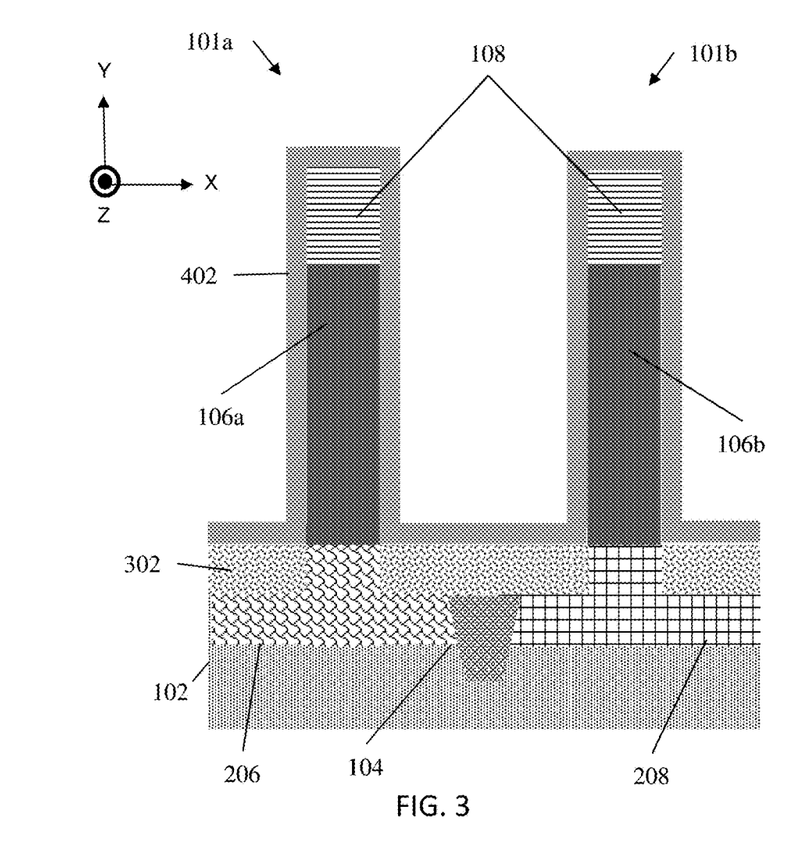
FIG. 3 depicts a cross-sectional view of a portion of the semiconductor structure after fabrication operations according to one or more embodiments of the invention.

FIG. 3 depicts a cross-sectional side view after removing the spacer layer 110 and depositing a bottom spacer 302 on the semiconductor materials 206, 208 of the source/drain regions and the STI 104 and depositing a germanium containing layer 402 on the fins 106a, 106b, the hard mask cap 108, and the bottom spacer 302. The spacer layer 110 can be removed through etching. The bottom spacer 302 is a low-k dielectric material. Some non-limiting examples of low-k dielectric materials include dielectric oxides (e.g., silicon oxide), dielectric nitrides (e.g., silicon nitride), dielectric oxynitrides, or any combination thereof.

In one or more embodiments of the invention, the germanium containing layer 402 is conformal. In one or more embodiments of the invention, the germanium containing layer is deposited by atomic layer deposition (ALD) and includes germanium oxide ($GeO_2$). The thickness of the germanium containing layer 402 can vary and is not intended to be limited. Yet, according to some embodiments of the invention, the germanium containing layer 402 can have a thickness of about 3 nm.

Figure 4:
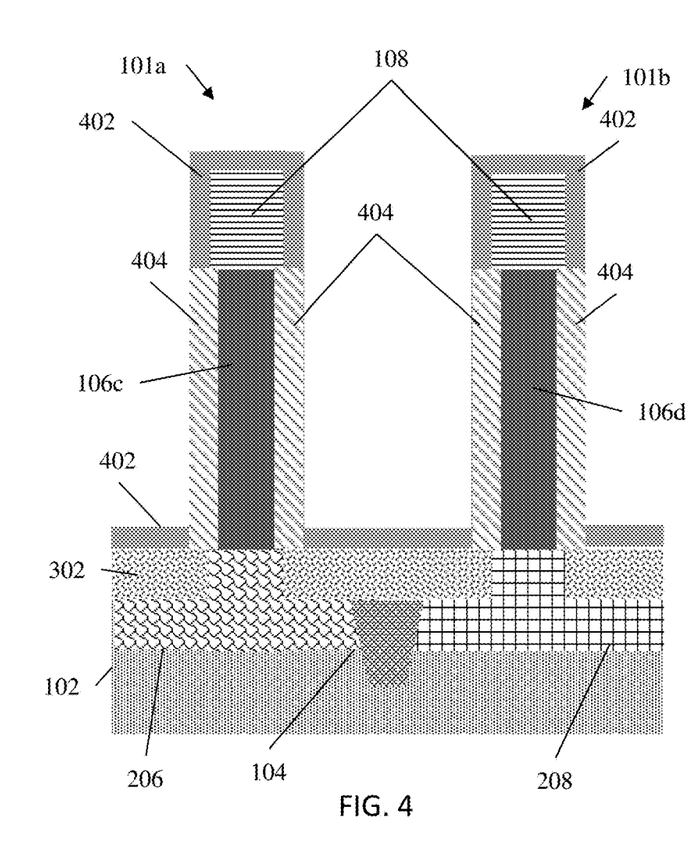
FIG. 4 depicts a cross-sectional view of a portion of the semiconductor structure after fabrication operations according to one or more embodiments of the invention.

FIG. 4 depicts a cross-sectional side view after annealing. Annealing induces a chemical reaction between the materials of the fins 106a, 106b and materials of the germanium containing layer 402, forming layers 404 and fins 106c, 106d. Layers 404 and fins 106c, 106d each include a chemical reaction product that results from reaction of the germanium containing layer 402 and the fins 106a, 106b. The germanium layer 402 on the hardmask cap 108 and the bottom spacer 302 remain unreacted.

The annealing is performed by, for example, heating inside a furnace or performing a rapid thermal treatment in an atmosphere that includes pure inert gases (e.g., nitrogen or argon). In exemplary embodiments of the invention, annealing is performed at about 700° C. for about 30 seconds in an ambient $N_2$ environment.

In one or more embodiments of the invention, before annealing, the fins 106a, 106b include silicon germanium with between 20% to 40% germanium content in the silicon germanium (i.e., SiGe20% to SiGe40%). After annealing, the germanium content of the silicon germanium increases to about SiGe60% to form fins 106c, 106d. Also, after annealing, layer 404 then includes a side layer of substantially pure silicon oxide ($SiO_2$). The following reaction occurs in one or more embodiments of the invention: $Si+Ge+2GeO_2 \rightarrow Ge+2GeO+SiO_2$.

Figure 5:
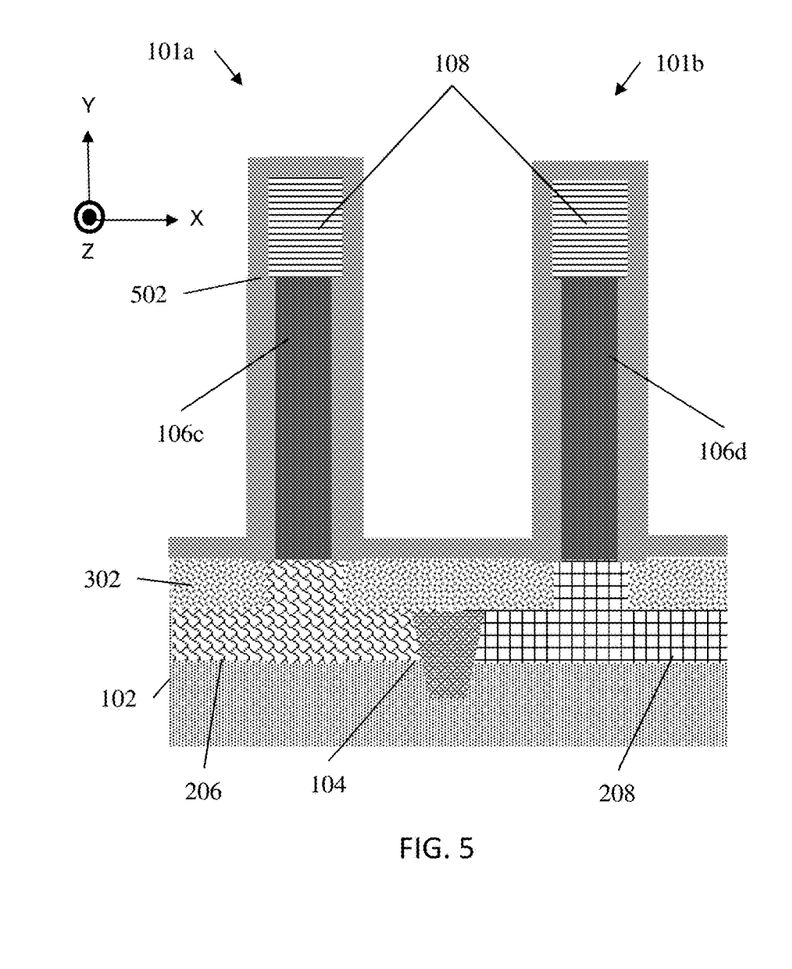
FIG. 5 depicts a cross-sectional view of a portion of the semiconductor structure after fabrication operations according to one or more embodiments of the invention.

FIG. 5 depicts a cross-sectional side view after, optionally, depositing a second germanium containing layer 502 on the fins 106c, 106d, the hard mask cap 108, and the bottom spacer 302. The germanium containing layer 502 is conformal. In one or more embodiments of the invention, the germanium containing layer is deposited by atomic layer deposition (ALD) and includes germanium oxide ($GeO_2$). The thickness of the germanium containing layer 502 can vary and is not intended to be limited.

Figure 6:
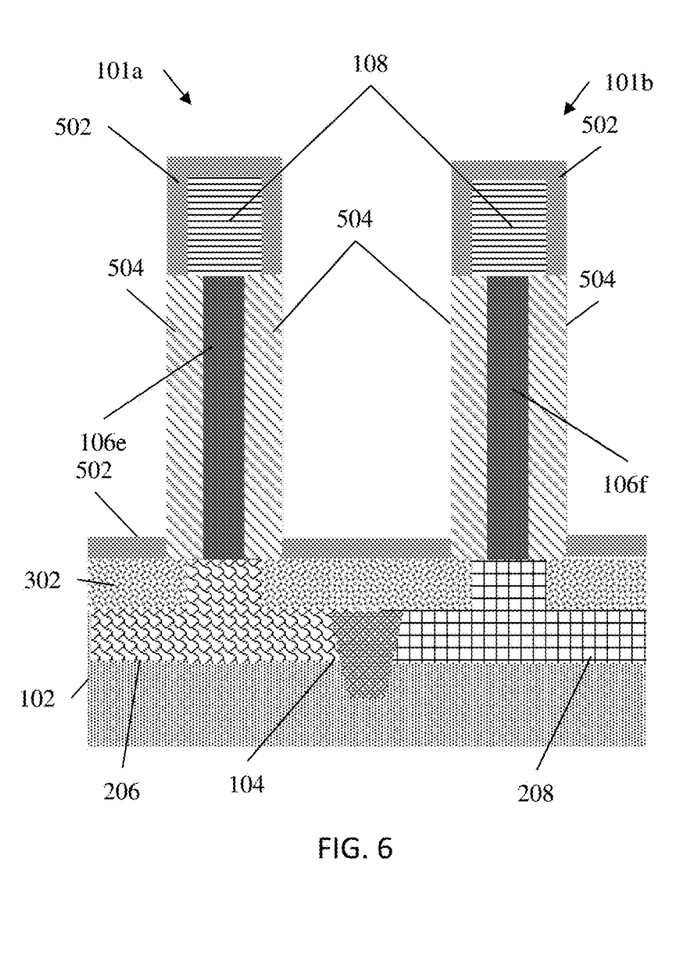
FIG. 6 depicts a cross-sectional view of a portion of the semiconductor structure after fabrication operations according to one or more embodiments of the invention.

FIG. 6 depicts a cross-sectional side view after annealing. Annealing induces a chemical reaction between the materials of the fins 106c, 106d and materials of the germanium containing layer 502, forming layers 504 and forming fins 106e, 106f. Layers 504 and fins 106e, 106f each include a chemical reaction product that results from reaction of the germanium containing layer 502 and the fins 106c, 106d. The germanium layer 502 on the hardmask cap 108 and the bottom spacer 302 remain unreacted. The Ge condensation process consumes Si or SiGe, where the Si atoms are preferentially oxidized. As a result, the thickness of the fin is reduced.

The annealing is performed by, for example, heating inside a furnace or performing a rapid thermal treatment in an atmosphere that includes pure inert gases (e.g., nitrogen or argon). In exemplary embodiments of the invention, annealing is performed at about 600° C. for about 30 seconds in an ambient $N_2$ environment.

In one or more embodiments of the invention, before annealing, the fins 106c, 106d includes silicon germanium with 60% germanium content in the silicon germanium (i.e., SiGe60%). After annealing, the germanium content of the silicon germanium increases to about SiGe80% to pure Ge to form fins 106e, 106f. Also, after annealing, layer 504 then includes a side layer of substantially pure silicon oxide ($SiO_2$). The following reaction occurs in one or more embodiments of the invention: $Si+Ge+2GeO_2 \rightarrow Ge+2GeO+SiO_2$.

Figure 7:
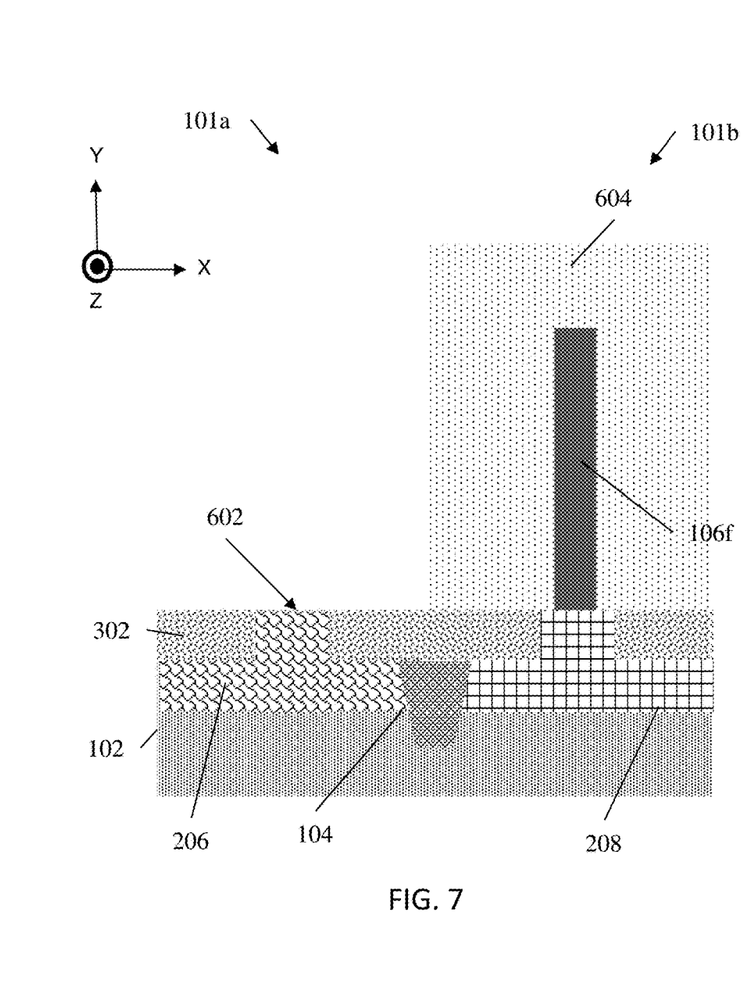
FIG. 7 depicts a cross-sectional view of a portion of the semiconductor structure after fabrication operations according to one or more embodiments of the invention.

FIG. 7 depicts a cross-sectional side view after removing the germanium containing layer 502, layer 504, and the hardmask cap 108 from the fins 106e, 106f and from the bottom spacer 302 and after depositing a mask 604 over the fin 106f of the second transistor 101b and a portion of the bottom spacer 302 and removing the fin 106e of the first transistor 101a. The removal of the germanium containing layer 502, layer 504, and the hardmask cap 108 can be done by selective reactive ion etch, selective wet etch processes, or a combination of both. The fin 106e of the first transistor 101a is removed through selective etching. The etching is selective to the exposed portion 602 of the source/drain material 206.

Figure 8:
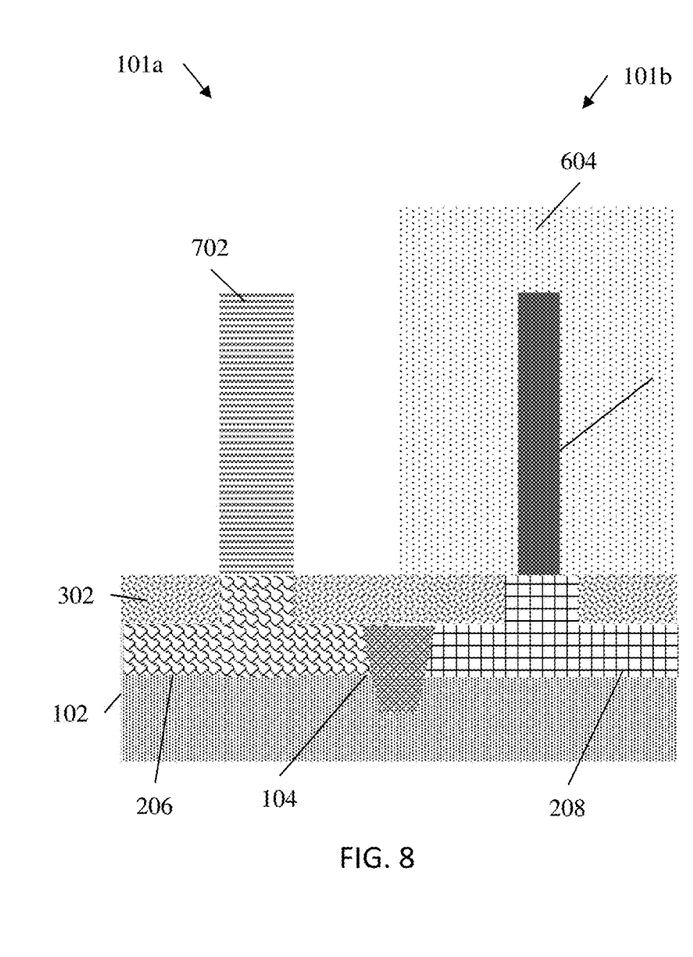
FIG. 8 depicts a cross-sectional view of a portion of the semiconductor structure after fabrication operations according to one or more embodiments of the invention.

FIG. 8 depicts a cross-sectional side view after growing a III-V fin 702 from the exposed doped semiconductor material 206. The fin 702 can be any type of III-V material such as, for example, GaAs (gallium arsenide), InAs (indium arsenide), InP (indium phosphide), or AlAs (aluminum arsenide) or any combination thereof.

Figure 9:
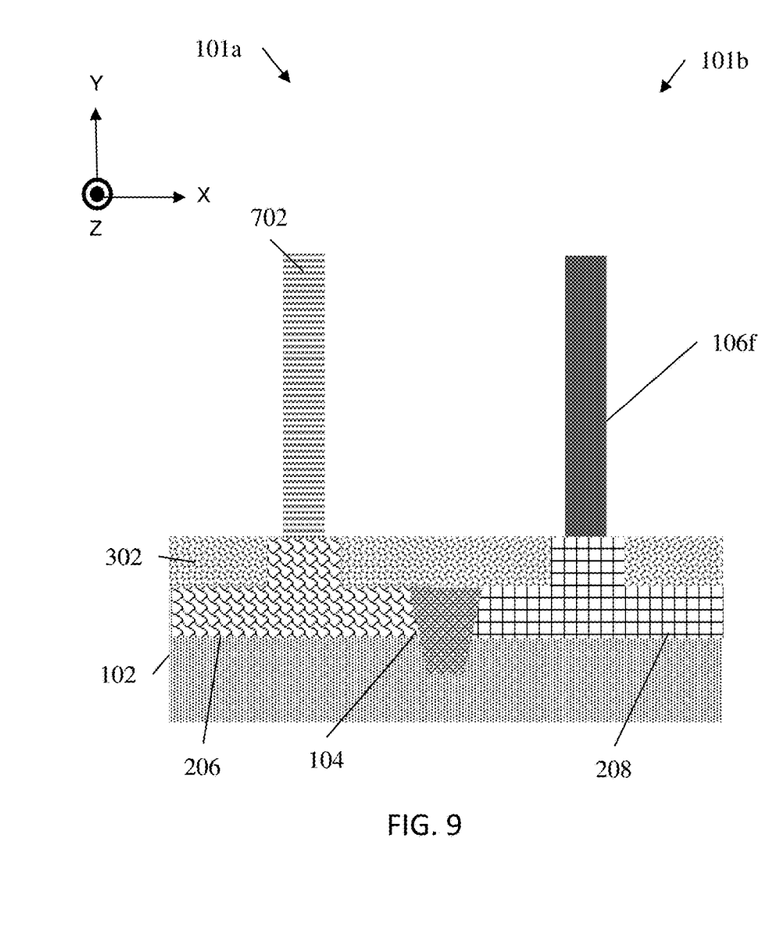
FIG. 9 depicts a cross-sectional view of a portion of the semiconductor structure after fabrication operations according to one or more embodiments of the invention.

FIG. 9 depicts a cross-sectional side view after etching the III-V fin 702 to substantially match the thickness of the fin 106f of the second transistor 101b and removal of the mask 604. The above described reactions to increase the germanium content in the silicon germanium fin 106f causes the thickness of the fin 106f to decrease as the germanium content is increased. The III-V fin 702 is grown from the semiconductor material 206 at a certain thickness. The III-V fin 702 can be digitally etched to substantially match the thickness of the fin 106. In one or more embodiments of the invention, the III-V fin 702 can have a width of about 10 to about 20 nanometers as grown and with sequential digital etch process (low-temperature oxidation, room-temperature plasma oxidation, and wet removal, such as in HCl:H2O solution) can be trimmed to about 5 to about 8 nanometers.

Figure 10:
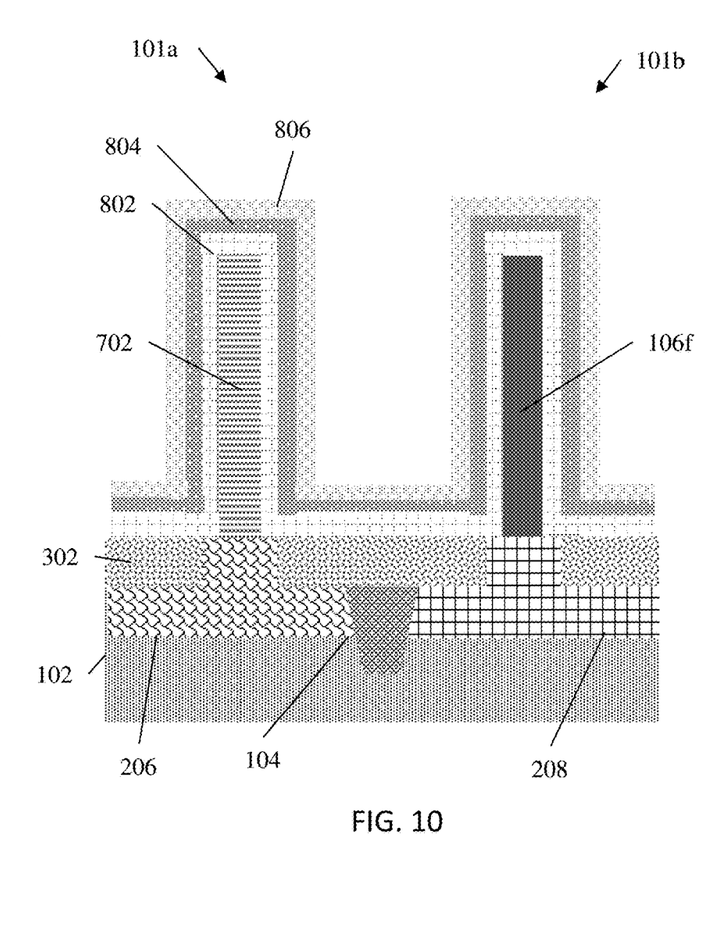
FIG. 10 depicts a cross-sectional view of a portion of the semiconductor structure after fabrication operations according to one or more embodiments of the invention.

FIG. 10 depicts a cross-sectional side view after pre-cleaning and depositing a high-k gate dielectric layer 802 and a work function metal layer 804. Gate dielectric layer 802 and work function metal layer 804 are part of the gate stack. Before depositing the gate stack layers, pre-cleaning is performed to remove chemical residue. The pre-cleaning process can include a light, non-selective, nonreactive etch, such as a plasma etch. According to some embodiments of the invention, the pre-cleaning includes hydrofluoric acid (HF) and hydrochloric acid (HCl).

The gate dielectric layer 802 and work function metal layer 804 are specific for the type of transistor. The gate dielectric material(s) can be a dielectric material having a dielectric constant greater than about 3.9, about 7.0, or about 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The work function metal layer 804, are disposed over the gate dielectric material 802. The type of work function metal(s) depends on the type of transistor and can differ between the first transistor 101a and second transistor 101b. Non-limiting examples of suitable work function metals include p-type work function metal materials and n-type work function metal materials. P-type work function materials include compositions such as titanium nitride (TiN), tantalum nitride (TaN), ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

In one or more embodiments, a dielectric layer 806 is deposited over the work function metal layer 804 for gate encapsulation. In one or more embodiments of the invention the dielectric layer 806 includes dielectric oxides (e.g., silicon oxide), dielectric nitrides (e.g., silicon nitride), dielectric oxynitrides, or any combination thereof.

Figure 11:
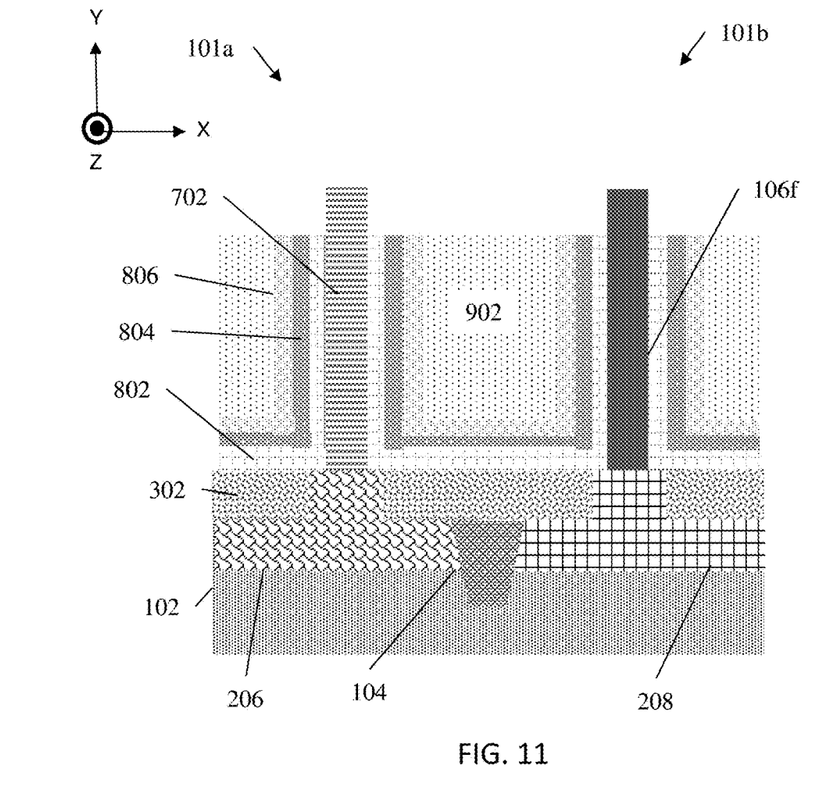
FIG. 11 depicts a cross-sectional view of a portion of the semiconductor structure after fabrication operations according to one or more embodiments of the invention.

FIG. 11 depicts a cross-sectional side view after depositing a planarization layer 902 and patterning the gate stack. The planarization layer 902 can be a spin-on coating, or an organic planarization layer (OPL). The planarization layer 902 is deposited on the fins 702, 106f and then recessed, for example, by etching. The gate dielectric layer 802, the work function metal 804, and the dielectric layer 806 can be etched by one or more etch processes such that they are recessed below exposed portions of the fins 702, 106f, if needed.

Figure 12:
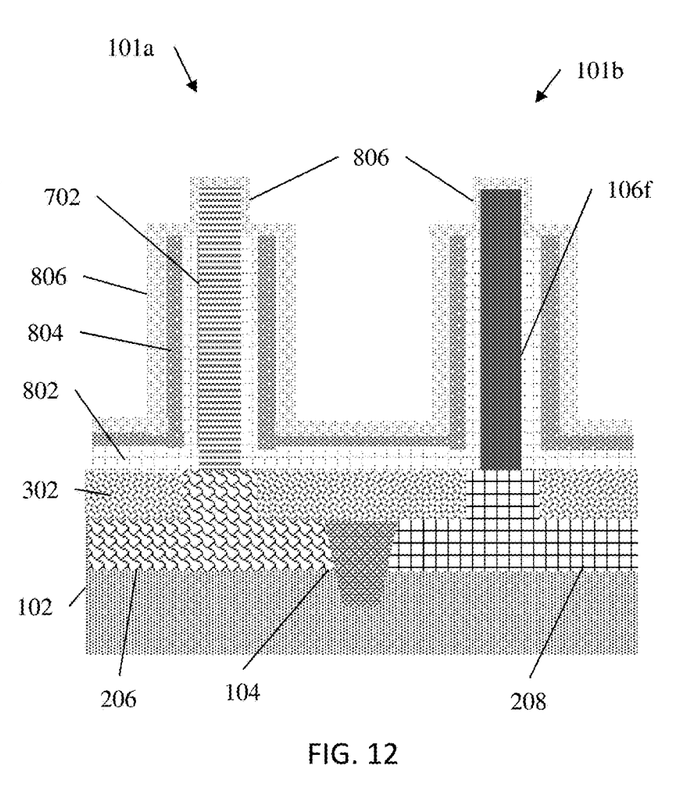
FIG. 12 depicts a cross-sectional view of a portion of the semiconductor structure after fabrication operations according to one or more embodiments of the invention.

FIG. 12 depicts a cross-sectional side view after removing the planarization layer 902 and depositing another layer of the dielectric layer 806. In one or more embodiments of the invention, the dielectric layer 806 is deposited conformally and the thickness of the dielectric layer 806 is less where the dielectric layer 806 is deposited on the exposed portions of the fins 702, 106f when compared to the thickness on the unexposed portion of the fins 702, 106f and on the work function metal layer 804. The planarization layer 902 can be removed using, for example, ashing.

Figure 13:
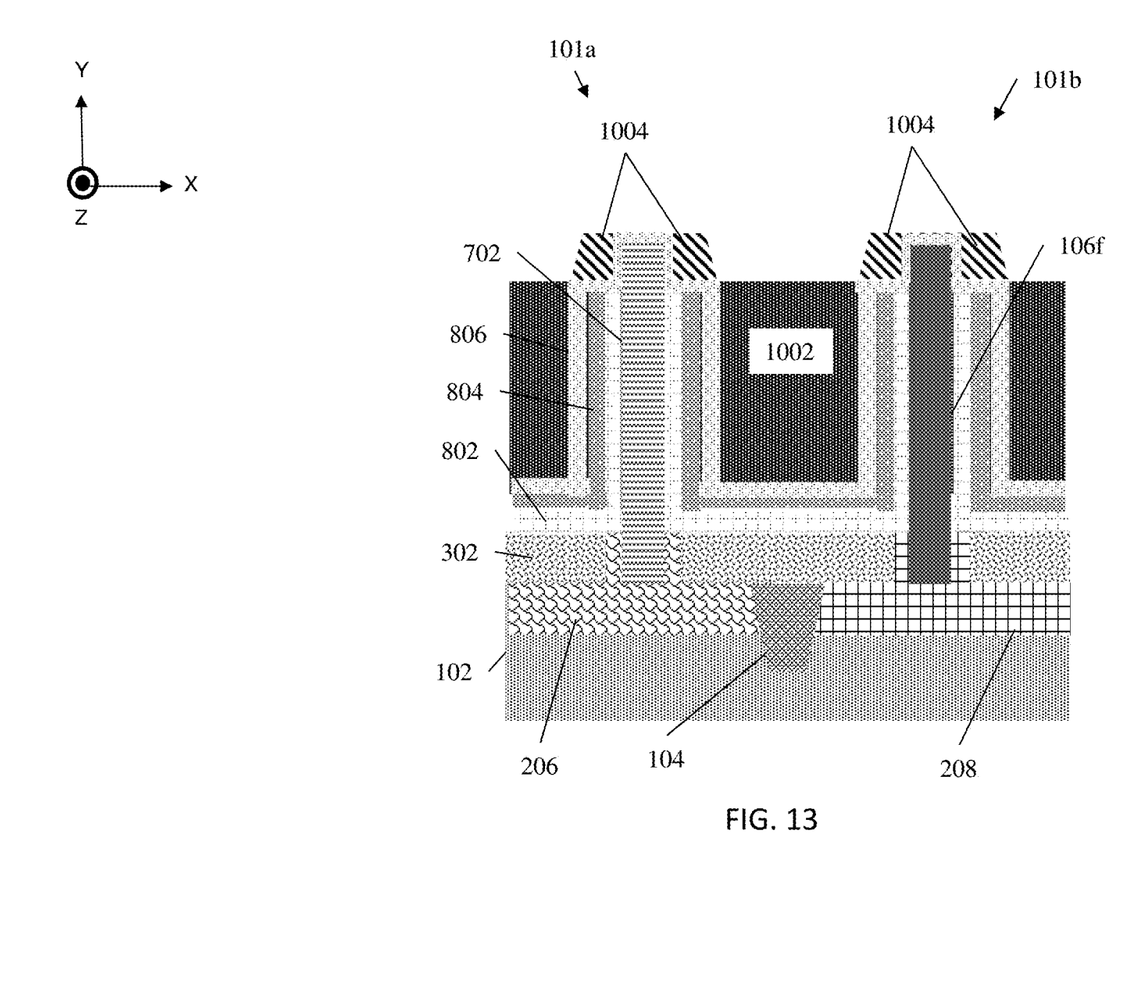
FIG. 13 depicts a cross-sectional view of a portion of the semiconductor structure after fabrication operations according to one or more embodiments of the invention.

FIG. 13 depicts a cross-sectional side view after depositing an oxide layer 1002 (inter layer dielectric (ILD)) and recessing and forming a top spacer 1004 on top of the gate stack. The oxide layer 1002 can include, but is not limited to, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The top spacer 1004 includes an insulating material, for example, silicon dioxide, silicon nitride, SiOCN, or SiBCN. Other non-limiting examples of materials for the top spacer 1004 include dielectric oxides (e.g., silicon oxide), dielectric nitrides (e.g., silicon nitride), dielectric oxynitrides, or any combination thereof. After being deposited, the spacer material is etched using any suitable etch such as, for example, reactive ion etching (RIE).

Figure 14:
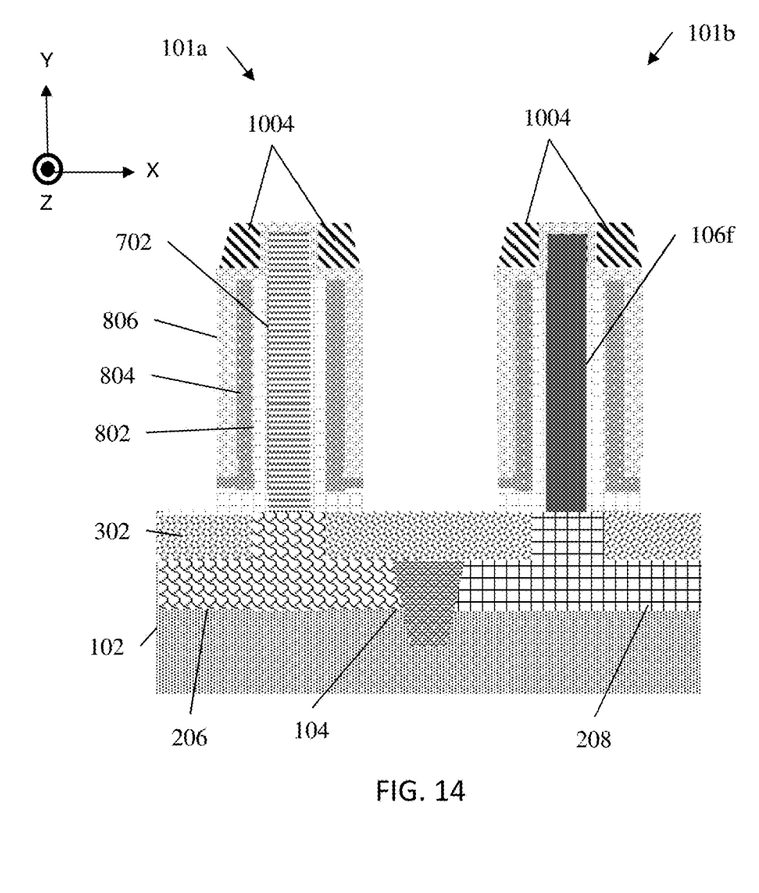
FIG. 14 depicts a cross-sectional view of a portion of the semiconductor structure after fabrication operations according to one or more embodiments of the invention.

FIG. 14 depicts a cross-sectional side view after removing the oxide layer 1002. The oxide layer 1002 can be etched, using the top spacers 1004 as a pattern. The oxide layer 1002 is etched selective to the bottom spacer 302.

Figure 15:
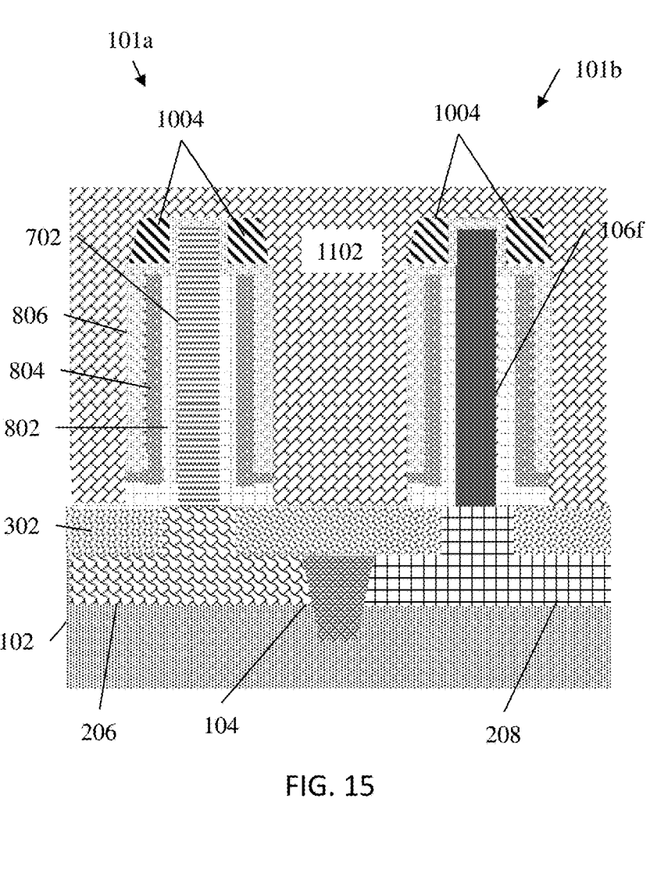
FIG. 15 depicts a cross-sectional view of a portion of the semiconductor structure after fabrication operations according to one or more embodiments of the invention.

FIG. 15 depicts a cross-sectional side view after depositing an oxide layer 1102. The oxide layer 1102 can include, but is not limited to, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 16:
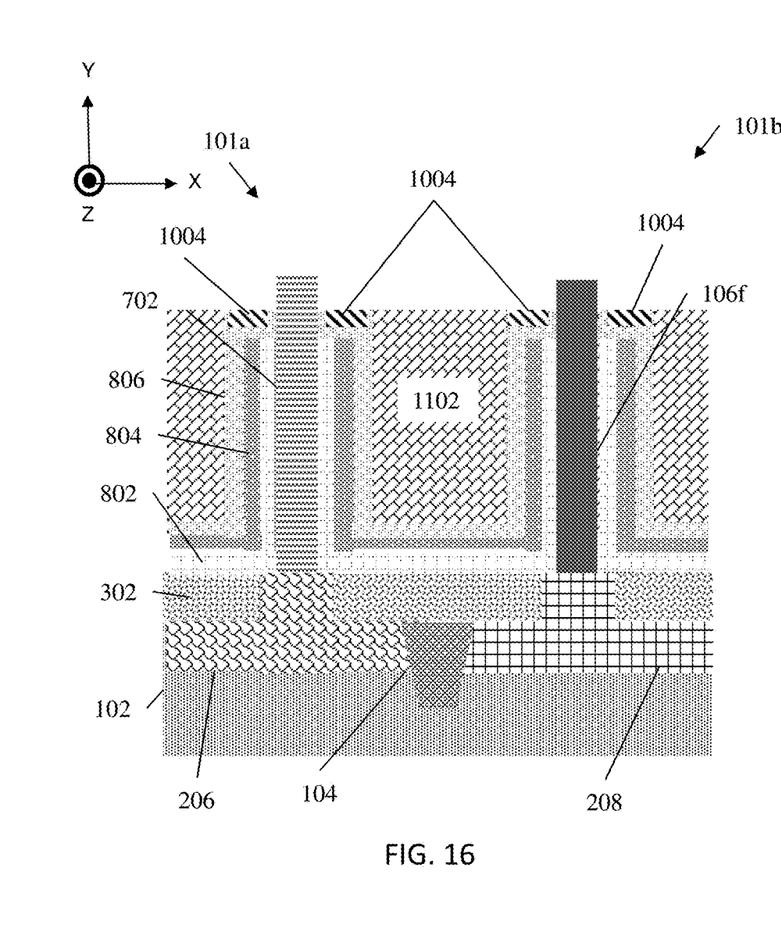
FIG. 16 depicts a cross-sectional view of a portion of the semiconductor structure after fabrication operations according to one or more embodiments of the invention.

FIG. 16 depicts a cross-sectional side view after recessing the oxide layer 1102. The oxide layer 1102 is recessed to a level below a top portion of the top spacers 1004. The top spacers 1004 are also partially recessed to expose the tops of the fins 702 and 106f, where the top source/drains will be formed.

Figure 17:
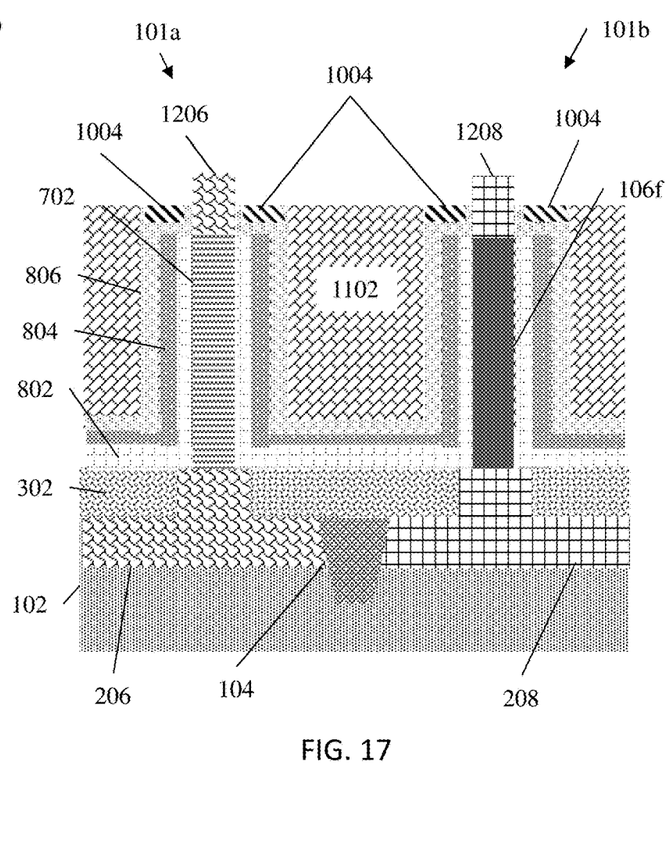
FIG. 17 depicts a cross-sectional view of a portion of the semiconductor structure after fabrication operations according to one or more embodiments of the invention.

FIG. 17 depicts a cross-sectional side view after doping the source/drains of the fins 702, 106f. The doping is performed using any suitable doping technique such as, for example, ion implementation, in-situ doped epitaxy, etc. For the III-V fin 702, the dopant can be Silicon (Si). For the Ge fin 106f, the dopant can be Boron (B). Annealing can be used to drive the dopants into the fins 702, 106f.

Figure 18:
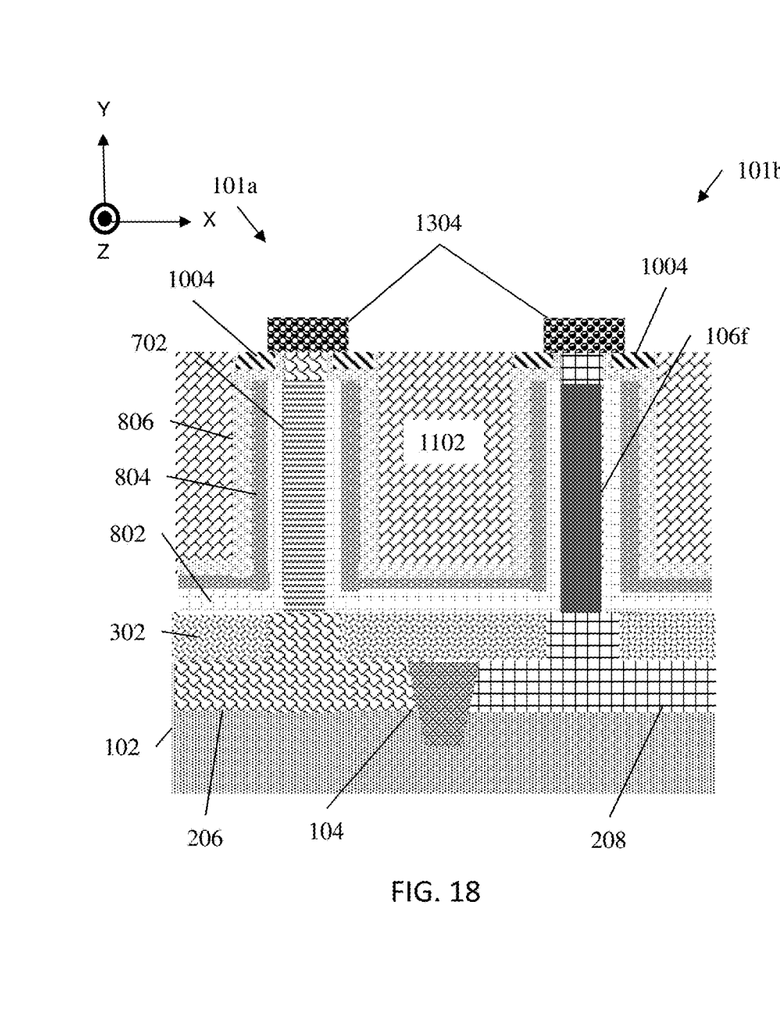
FIG. 18 depicts a cross-sectional view of a portion of the semiconductor structure after fabrication operations according to one or more embodiments of the invention.

FIG. 18 depicts a cross-sectional side view after forming a silicide 1304 over the exposed portions of the fins 702, 106f and removing any unreacted metal.

Figure 19:
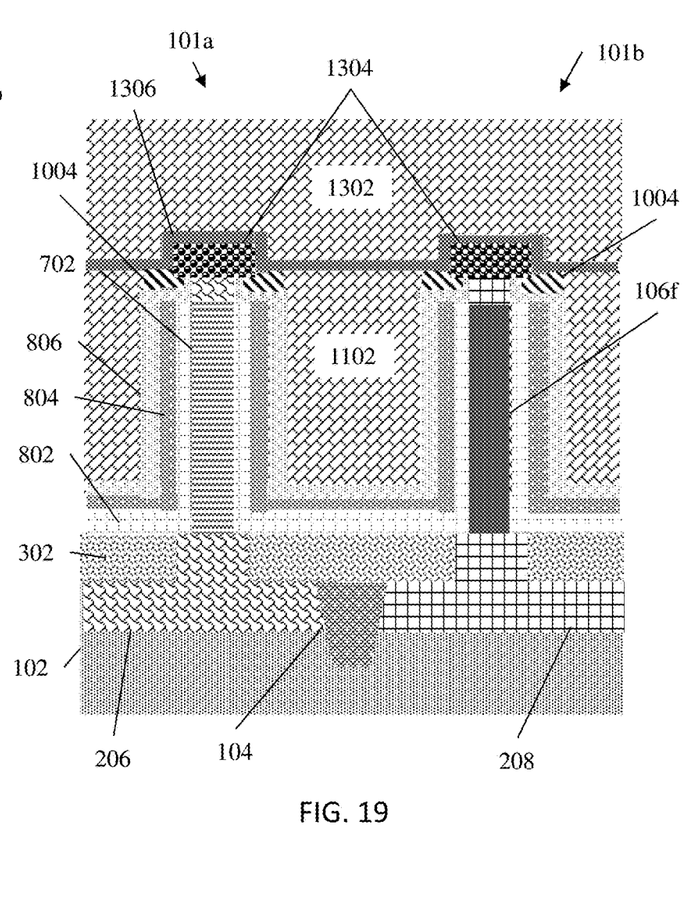
FIG. 19 depicts a cross-sectional view of a portion of the semiconductor structure after fabrication operations according to one or more embodiments of the invention.

FIG. 19 depicts a cross-sectional side view after depositing a liner layer 1306 and another oxide layer 1302 on the silicide 1304 and the oxide layer 1102 and top spacers 1004. The liner layer 1306 encapsulates the source/drains. The liner 1306 is used as an etch stop liner when the top source/drain contacts are formed.

Figure 20:
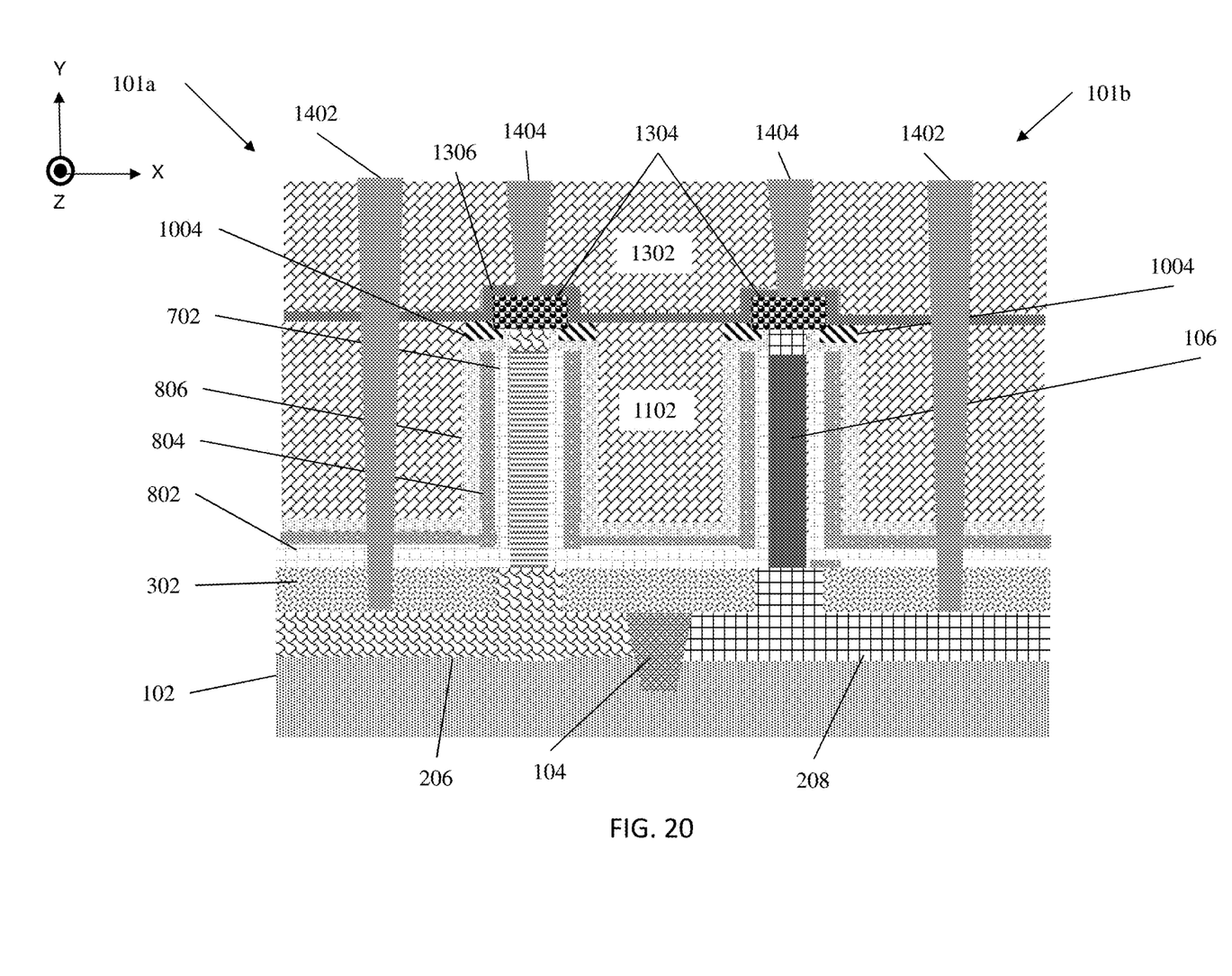
FIG. 20 depicts a cross-sectional view of a portion of the semiconductor structure after fabrication operations according to one or more embodiments of the invention.

FIG. 20 depicts a cross-sectional view after forming top and bottom contacts 1402 (source/drain contacts) according to one or more embodiments of the invention. The bottom source/drains regions 206, 208 can be selectively etched to provide a contract area for the bottom contacts 1402 and the top source/drain silicide 1306 can be selectively etched to provide a contact area for the top contacts 1404. The top contacts 1404 are formed in the oxide layer 1302 and the bottom contacts 1402 can formed in the oxide layers 1302, 1102 by etching trenches. The bottom contacts 1402 extend through the oxide layers 1102, 1302 and to semiconductor materials 206, 208 that form the bottom source/drain regions. A resist, such as a photoresist, can be deposited and patterned to form the contact trenches for the bottom contacts 1402. An etch process, such as a RIE, is performed to remove the oxide layers 1102, 1302, liner layer 1306, layer 806, layer 804, layer 802, and the bottom spacer 302. A similar etch process is used for the top contacts 1404. The contact trenches are filled with a conductive material or combination of conductive materials. The conductive material can be any type of conductive material include, for example, aluminum (Al), platinum (Pt), gold (Au), tungsten (W), titanium (Ti), cobalt (Co), or any combination thereof.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating semiconductor devices, the method comprising:
    forming a first fin and a second fin on a substrate;
    wherein the first fin comprises a first material comprising a first semiconductor material at a first concentration level;
    wherein the second fin comprises a second material comprising a second semiconductor material at a second concentration;
    performing a condensation oxidation to:
        increase the first concentration level to a targeted first final concentration level; and
        increase the second concentration level to a targeted second final concentration level; and
    replacing the second fin with a third fin comprising a third material comprising a combination of a group III element with a group V element, wherein replacing the second fin with the third fin comprises:
    removing the second fin from the substrate;
    growing the third fin from a second source/drain region formed and arranged under the second fin.

2. The method of claim 1, wherein the condensation oxidation comprises:
    depositing a germanium containing layer on the first fin; and
    applying an anneal operation configured to chemically react the first fin with the germanium containing layer and form a silicon oxide layer.

3. The method of claim 1, wherein the first semiconductor material is silicon germanium.

4. The method of claim 3, wherein the first concentration level includes a first germanium content.

5. The method of claim 4, wherein the first germanium content comprises from about 20 to about 40 atomic percentage (%) germanium.

6. The method of claim 1, wherein the first final concentration level includes a second germanium content.

7. The method of claim 6, wherein the second germanium content comprises from about 80 to about 100 atomic percentage (%) germanium.

8. A method of fabricating a semiconductor device, the method comprising:
    forming a first fin and a second fin on a substrate;
    wherein the first fin comprises a first material comprising a first semiconductor material at a first concentration level;
    wherein the second fin comprises a second material comprising a second semiconductor material at a second concentration level;
    performing a condensation oxidation to:
        increase the first concentration level to a third concentration level; and
        increase the second concentration level to a fourth concentration level;
    forming a first source/drain region comprising a first portion arranged under the first fin in the substrate and a second portion arranged adjacent to the first fin;
    forming a second source/drain region comprising a third portion arranged under the second fin in the substrate and a fourth portion arranged adjacent to the second fin;
    removing the first fin from the substrate; and
    forming a third fin formed on the first source/drain region, wherein the third fin comprises a third semiconductor material, wherein forming the third fin formed on the first source/drain region comprises growing the third fin from the first source/drain region.

9. The method of claim 8, wherein the condensation oxidation comprises:
    depositing a germanium containing layer on the first fin and the second fin; and
    applying an anneal operation configured to chemically react the first fin and the second fin with the germanium containing layer and form a silicon oxide layer.

10. The method of claim 8, wherein the first source/drain region is a p-type source/drain region; and
    wherein the second source/drain region is a n-type source/drain region.

11. The method of claim 8, wherein the second semiconductor material comprises silicon germanium; and
    wherein the third semiconductor material comprises a combination of a group III element with a group V element.

12. The method of claim 8, wherein the first semiconductor material is silicon germanium.

13. The method of claim 12, wherein the first concentration level comprises a first germanium concentration comprises from about 20 to about 40 atomic percentage (%) germanium.

14. The method of claim 13, wherein the third concentration level comprises a third germanium concentration comprising from about 60 to about 80 atomic percentage (%) germanium.

15. The method of claim 14 further comprising performing a second condensation oxidation to:
    increase the third concentration level to a fifth concentration level.

16. The method of claim 15, wherein the fifth concentration level comprises a fifth germanium concentration comprising from about 80 to about 100 atomic percentage (%) germanium.

* * * * *